United States Patent
Kubota et al.

(10) Patent No.: US 8,753,749 B2
(45) Date of Patent: Jun. 17, 2014

(54) THERMAL EXPANSION SUPPRESSING MEMBER AND ANTI-THERMALLY-EXPANSIVE MEMBER

(75) Inventors: Makoto Kubota, Yokohama (JP); Kaoru Miura, Matsudo (JP); Hisato Yabuta, Machida (JP); Yoshihiko Matsumura, Tokyo (JP); Yuichi Shimakawa, Uji (JP); Masaki Azuma, Uji (JP)

(73) Assignees: Canon Kabushiki Kaisha, Tokyo (JP); Kyoto University, Kyoto-shi (JP)

( * ) Notice: Subject to any disclaimer, the term of this patent is extended or adjusted under 35 U.S.C. 154(b) by 0 days.

(21) Appl. No.: 13/205,272

(22) Filed: Aug. 8, 2011

(65) Prior Publication Data

US 2012/0040196 A1 Feb. 16, 2012

(30) Foreign Application Priority Data

Aug. 12, 2010 (JP) ................................ 2010-180885
Apr. 26, 2011 (JP) ................................ 2011-097851

(51) Int. Cl.
- *B32B 15/04* (2006.01)
- *C04B 35/453* (2006.01)
- *C04B 35/50* (2006.01)

(52) U.S. Cl.
USPC ........... 428/469; 428/701; 428/702; 501/152; 501/1

(58) Field of Classification Search
None
See application file for complete search history.

(56) References Cited

U.S. PATENT DOCUMENTS

| | | | |
|---|---|---|---|
| 5,694,503 A | 12/1997 | Fleming et al. | |
| 7,187,083 B2 | 3/2007 | Lewis et al. | |
| 7,663,242 B2 | 2/2010 | Lewis et al. | |
| 2002/0175403 A1 | 11/2002 | Sreeram et al. | |
| 2003/0062553 A1* | 4/2003 | Ramesh et al. | 257/295 |
| 2005/0191515 A1 | 9/2005 | Brese et al. | |
| 2006/0118160 A1* | 6/2006 | Funahashi et al. | 136/236.1 |
| 2007/0125412 A1* | 6/2007 | Funahashi | 136/201 |
| 2007/0135550 A1 | 6/2007 | Chakrapani et al. | |
| 2009/0004087 A1 | 1/2009 | Takenaka et al. | |
| 2012/0037842 A1* | 2/2012 | Kubota et al. | 252/70 |

FOREIGN PATENT DOCUMENTS

| | | |
|---|---|---|
| CN | 1526029 A | 9/2004 |
| JP | 61-175035 A | 8/1986 |
| JP | 10-096827 A | 4/1998 |
| JP | 2008-260892 A | 10/2008 |

(Continued)

OTHER PUBLICATIONS

Ishiwata et al. Kotai no Hannosei Toronkai Koen Yokoshu, 2002, vol. 13, abstract.*

(Continued)

*Primary Examiner* — Vera Katz
(74) *Attorney, Agent, or Firm* — Fitzpatrick, Cella, Harper & Scinto

(57) ABSTRACT

Provided are a thermal expansion suppressing member having negative thermal expansion properties and a metal-based anti-thermally-expansive member having small thermal expansion. More specifically, provided are a thermal expansion suppressing member, including at least an oxide represented by the following general formula (1), and an anti-thermally-expansive member, including a metal having a positive linear expansion coefficient at 20° C., and a solid body including at least an oxide represented by the following general formula (1), the metal and solid being joined to each other: $(Bi_{1-x}M_x)NiO_3$ (1) where M represents at least one metal selected from the group consisting of La, Pr, Nd, Sm, Eu, Gd, Tb, Dy, Ho, Er, Tm, Yb, Lu, Y, and In; and x represents a numerical value of $0.02 \leq x \leq 0.15$.

4 Claims, 3 Drawing Sheets

(56) References Cited

FOREIGN PATENT DOCUMENTS

| | | |
|---|---|---|
| JP | 2010-021429 A | 1/2010 |
| JP | 2010-029990 A | 2/2010 |
| WO | 2006/011590 A1 | 2/2006 |

OTHER PUBLICATIONS

Azuma et al. Nature communication, Jun. 2011, p. 1-5.*

S. Ishiwata et al., "Pressure/temperature/substitution-induced Melting of A-site Charge Disproportionation in Bi1-xLaxNiO3 ($0 \leq x \leq 0.5$)," Los Alomos National Laboratory, Reprint Archive, Condensed Matter, pp. 1-24 (http://xxx.lanl.gov/ftp/cond-mat/papers/0502/0502066.pdf) (Feb. 2005) (XP-002664113).

H. Wadati et al., "Valence changes associated with the metal-insulator transition in Bi1-xLaxNiO3," Los Alomos National Laboratory, Reprint Archive, Condensed Matter, pp. 1-6 (http://xxx.lanl.gov/PS_cache/cond-mat/pdf/0505/0505646v1.pdf) (May 2005) (XP-002664114).

Shintaro Ishiwata et al., "Suppression of A Site Charge Disproportionation in Bi1-xLaxNiO3," 329-333 Physica B 813-814 (2003) (XP-002664115).

Thermal expansion—Wikipedia, the free encyclopedia (13 pages; Nov. 2011) (XP-002664116).

List of thermal conductivities—Wikipedia, the free encyclopedia (9 pages; Oct. 2011) (XP-002664117).

Extended European Search Report in Application No. 11177212.5 (Dec. 2011).

Office Action in Chinese Application No. 201110226208.1 (dated Jun. 4, 2013).

Goodfellows (Polybenzimidazole, 3 pages) (2013).

Non-final Office Action in U.S. Appl. No. 13/205,258 (dated Jun. 11, 2013).

Non-final Office Action in U.S. Appl. No. 13/205,258 (dated Jan. 11, 2013).

H. Wadati et al., "Valence Changes Associated with the Metal-Insulator Transition in Bi1-xLaxNiO3," 72 Phys. Rev. B 155103-1-155103-5 (Oct. 2005).

S. Ishiwata et al., "Pressure/Temperature/Substitution-Induced Melting of A-site Charge Disproportionation in Bi1-xLaxNiO3 ($0 \leq x \leq 0.5$)," 72 Phys. Rev. B 045104-1-045104-7 (Jul. 2005).

Hiroki Wadati et al., "Temperature-Dependent Photoemission and X-Ray Absorption Studies of the Metal-Insulator Transition in Bi1-xLaxNiO3," 76 Phys. Rev. B 205123-1-205123-4 (Nov. 2007).

* cited by examiner

THERMAL EXPANSION SUPPRESSING MEMBER AND ANTI-THERMALLY-EXPANSIVE MEMBER

BACKGROUND OF THE INVENTION

1. Field of the Invention

The present invention relates to a thermal expansion suppressing member and an anti-thermally-expansive member, and more particularly, to a novel anti-thermally-expansive member, including an oxide having negative thermal expansion properties which is joined to a metal.

2. Description of the Related Art

In general, an electronic member, an optical member, and a structural member are made of materials such as metal, resin, ceramic, and glass. These conventional materials expand or contract depending upon an increase or decrease in environmental temperature due to their positive thermal expansion properties.

For example, in a conventional metal-based heat radiation plate (heat sink), metal members mainly containing aluminum and copper having good thermal conduction have been widely used. These metal members have thermal expansion largely different from those of members such as an insulator, a semiconductor, and a solder to be cooled, and hence, there is a problem in that the metal members have adverse effects caused by thermal stress strain.

In order to solve such problem, the use of a metal oxide having negative thermal expansion properties has been proposed.

For example, Japanese Patent Application Laid-Open No. H10-096827 discloses an optical fiber element in which thermal expansion is suppressed using $ZrW_2O_8$ having a linear expansion coefficient in the range of $-4.7 \times 10^{-6}$/K to $-9.4 \times 10^{-6}$/K. However, there is a problem in that a negative thermal expansion material of a tungstate-based metal oxide still has a small absolute value of a linear expansion coefficient.

PCT Publication WO06-011590A discloses a material including a manganese nitride as a main component to increase a negative linear expansion coefficient to $-60 \times 10^{-6}$/K at largest. However, there are problems in that such negative thermal expansion material including a manganese nitride exhibits negative thermal expansion properties in a narrow temperature region, and in that the material having a larger absolute value of a linear expansion coefficient exhibits negative thermal expansion properties in lower temperature regions compared with a practical temperature region.

The present invention has been achieved in order to solve the above-mentioned problems. An object of the present invention is to provide a Bi-based thermal expansion suppressing member having negative thermal expansion properties and an anti-thermally-expansive member including the thermal expansion suppressing member joined to a metal.

SUMMARY OF THE INVENTION

A thermal expansion suppressing member for solving the above-mentioned problems includes at least an oxide represented by the following general formula (1):

$$(Bi_{1-x}M_x)NiO_3 \qquad (1)$$

where M represents at least one metal selected from the group consisting of La, Pr, Nd, Sm, Eu, Gd, Tb, Dy, Ho, Er, Tm, Yb, Lu, Y, and In; and x represents a numerical value of $0.02 \leq x \leq 0.15$.

An anti-thermally-expansive member includes a metal having a positive linear expansion coefficient at 20° C., and a solid body including at least an oxide represented by the following general formula (1), the metal and the solid body being joined to each other:

$$(Bi_{1-x}M_x)NiO_3 \qquad (1)$$

where M represents at least one metal selected from the group consisting of La, Pr, Nd, Sm, Eu, Gd, Tb, Dy, Ho, Er, Tm, Yb, Lu, Y, and In; and x represents a numerical value of $0.02 \leq x \leq 0.15$.

According to the present invention, the thermal expansion suppressing member having negative thermal expansion properties can be provided. Further, according to the present invention, the metal-based anti-thermally-expansive member having extremely small thermal expansion can be provided by joining the thermal expansion suppressing member of the present invention to a metal.

Further features of the present invention will become apparent from the following description of exemplary embodiments with reference to the attached drawings.

DESCRIPTION OF THE EMBODIMENTS

Hereinafter, the present invention is described by way of embodiments for carrying out the present invention.

A thermal expansion suppressing member according to the present invention includes at least an oxide represented by the following general formula (1):

$$(Bi_{1-x}M_x)NiO_3 \qquad (1)$$

(where M represents at least one metal selected from the group consisting of La, Pr, Nd, Sm, Eu, Gd, Tb, Dy, Ho, Er, Tm, Yb, Lu, Y, and In; and x represents a numerical value of $0.02 \leq x \leq 0.15$).

Figure 1:
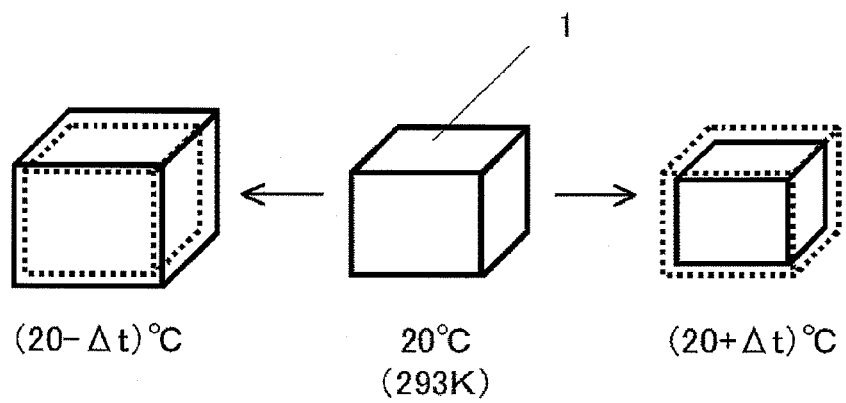
FIG. 1 is a schematic view showing a concept of thermal expansion properties of a thermal expansion suppressing member of the present invention.

FIG. 1 a view conceptually showing thermal expansion properties of a thermal expansion suppressing member of the present invention. A thermal expansion suppressing member 1 of the present invention in the figure has negative thermal expansion properties under a normal condition (standard condition). The volume thereof contracts along with an increase in temperature and expands along with a decrease in temperature. According to IEC60068-1 specification (JIS C60068-1 standard) "Environment Test Method—Electricity/Electron—General Rule," the normal condition in a test of electric products and industrial products is as follows: a temperature of 20° C. (293 K) and an atmospheric pressure of 101.3 kPa. In the figure, although the thermal expansion suppressing member 1 is shown as a rectangular solid for convenience, the shape of the thermal expansion suppressing member 1 is not limited. For example, the shape of the thermal expansion suppressing member 1 may have a plate shape, a powdery shape, or a mass of indefinite shape depending upon applications. The thermal expansion suppressing member 1 of the present invention exhibits negative thermal expansion behavior when being an independent object, as shown in FIG. 1. The linear expansion coefficient at 20° C. at that time varies to some degree depending upon its composition, crystal grain diameter and density and is about $-20 \times 10^{-6}$/K to $-85 \times 10^{-6}$/

K. As the crystal grain diameter is smaller and the density is higher, the linear expansion coefficient of the thermal expansion suppressing member tends to increase toward the negative direction. On the other hand, when the thermal expansion suppressing member 1 of the present invention is joined to another member or dispersed in another member, the thermal expansion of the entire member is made close to zero or made negative, if required, by the thermal stress generated at an interface between the thermal expansion suppressing member 1 and the another member.

The oxide represented by the general formula (1) refers to a complex metal oxide of Bi, M, and Ni. In other words, a part of the bismuth sites of bismuth nickelate represented by a general formula $BiNiO_3$ is substituted with M.

In the general formula (1), the chemical formula of the oxide is represented so that the atomic ratio of the respective sites is 1:1:3 as an ideal composition. However, actually, similar physical properties are exhibited even when there is an excess or shortage within 10% in the atomic ratio of the respective sites.

The oxide represented by the general formula (1) tends to undergo crystal phase transition with respect to a change in environment temperature or external pressure. For convenience of description, a crystal phase at a lower temperature or lower pressure compared with a phase transition point is referred to as a first phase and a crystal phase at a higher temperature or higher pressure compared with the phase transition point is referred to as a second phase.

The first phase is an antiferromagnetic insulator having a triclinic perovskite structure including a unit cell of $\sqrt{2}a \times \sqrt{2}a \times 2a$. In the unit cell, Bi ions are disproportionated in terms of charge. That is, one half of the B ions are trivalent and the other half thereof are pentavalent. The chemical formula of bismuth nickelate, the substitution of which with M is omitted, can be represented by $Bi^{3+}_{0.5}Bi^{5+}_{0.5}Ni^{2+}O_3$.

When pressure energy or thermal energy is added to the first phase, charge transfer occurs between $Bi^{5+}$ and $Ni^{2+}$, and phase transition to a second phase, represented by $Bi^{3+}Ni^{3+}O_3$ occurs. The second phase is a conductor having an orthorhombic perovskite structure commonly called a $GdFeO_3$ type. The phase transition undergoes a mixed region of the first phase and the second phase.

The unit cell volume of the second phase is smaller than the unit cell volume of the first phase by about 2.6%. This is because the lattice length of a Ni—O bond is different between divalence and trivalence. This is considered as a factor by which the oxide represented by the general formula (1) exhibits negative thermal expansion properties.

M in the general formula (1) is at least one metal selected from La, Pr, Nd, Sm, Eu, Gd, Tb, Dy, Ho, Er, Tm, Yb, Lu, Y, and In. Trivalent ions of any of these elements are stable and can substitute Bi sites. The thermal stability of the second phase increases by partially substituting the Bi sites with trivalent M. As a result, the lower limit temperature at which the oxide represented by the general formula (1) exhibits negative thermal expansion properties can be extended to lower temperatures. Further, as the ion radius of $M^{3+}$ is smaller, the linear expansion coefficient at 20° C. tends to increase toward the negative direction.

It should be noted that a parameter x representing a substitution atomic ratio of M is in a range of $0.02 \leq x \leq 0.15$. When x is smaller than 0.02, thermal decomposition of the oxide is liable to occur at a temperature equal to or lower than the temperature at which the phase transition to the second phase occurs. On the other hand, when x is larger than 0.15, the stability of the second phase becomes too large, and the volume shrinkage involved in the phase transition, that is, the negative linear expansion coefficient becomes small.

When the orthorhombic strain (b/a) of $M^{3+}Ni^{3+}O_3$ is smaller than that of $Bi^{3+}Ni^{3+}O_3$, the stability of the second phase further increases to exert an effect on the suppression of the thermal decomposition in a high temperature range (for example, about 250° C.). From this point of view, M more preferably represents at least one metal selected from La, Pr, Nd, Sm, Eu, and Gd.

A method of producing the oxide represented by the general formula (1) is not particularly limited. A method capable of synthesizing a complex metal oxide in which the metal elements form a uniform solid solution and molding the oxide in any shape is preferred. For example, when the respective oxides of Bi, M, and Ni are mixed at the same molar ratio as that of an intended substance and sintered under a high pressure (e.g., 4 GPa or more), a complex metal oxide in which the respective metal elements form a uniform solid solution is obtained. When the obtained oxide is crushed and molded and baked at a temperature equal to or lower than that for the sintering, a thermal expansion suppressing member of the present invention is obtained. The method of molding the oxide is not particularly limited, and a general procedure for molding of ceramics can be used. Examples of the method of molding the oxide represented by the general formula (1) include uniaxial pressure molding (metallic molding), cold isostatic pressing (CIP), hot isostatic pressing (HIP), hot pressing, extrusion molding, injection molding, slipcasting, a doctor blade method, and an aerosol deposition method.

The thermal expansion suppressing member 1 of the present invention may contain components other than the oxide represented by the general formula (1) (other components). The other components may be dispersed inside the thermal expansion suppressing member 1 or may be coated on the surface. Examples of the other components include an adhesive component with other members, coloring components such as a dye and a pigment, an electrode for monitoring electric characteristics, and components for adjusting other properties.

An anti-thermally-expansive member according to the present invention includes a metal having a positive linear expansion coefficient at 20° C., and a solid body including at least an oxide represented by the following general formula (1), the metal and the solid body being joined to each other:

$$(Bi_{1-x}M_x)NiO_3 \quad\quad\quad (1)$$

(where M represents at least one metal selected from the group consisting of La, Pr, Nd, Sm, Eu, Gd, Tb, Dy, Ho, Er, Tm, Yb, Lu, Y, and In; and x represents a numerical value of $0.02 \leq x \leq 0.15$).

In the present invention, the anti-thermally-expansive member is intended to refer to a member in which a volume change with respect to heat is suppressed. Although it depends on the selection of a material, for example, a member having a linear expansion coefficient under a normal condition (20° C., 101.3 kPa) in a range of $-5 \times 10^{-6}$/K to $+5 \times 10^{-6}$/K can be used as an anti-thermally-expansive member. Alternatively, a member having a linear expansion coefficient in a practical temperature region of the member in a range of $-10 \times 10^{-6}$/K to $+10 \times 10^{-6}$/K can be used as the anti-thermally-expansive member.

FIGS. 2A to 2H are vertical cross-sectional schematic views showing examples of embodiments of the anti-thermally-expansive member of the present invention. The anti-thermally-expansive member of the present invention is denoted with a reference numeral 2 in the figure.

Figure 2A:
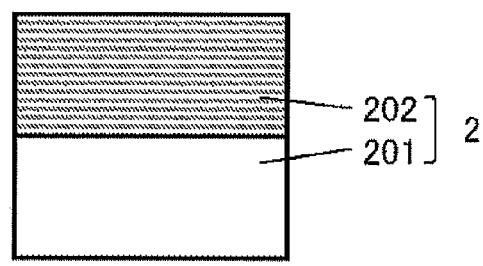
FIGS. 2A, 2B, 2C, 2D, 2E, 2F, 2G and 2H are vertical cross-sectional schematic views showing examples of embodiments of an anti-thermally-expansive member of the present invention.

Referring to the construction of FIG. 2A as an example, the anti-thermally-expansive member 2 includes a solid body 201 and a metal 202 jointed to each other.

The solid body 201 is a solid body containing at least the oxide represented by the above-mentioned general formula (1), and the thermal expansion suppressing member of the present invention can be used for the solid body. The solid body 201 has negative thermal expansion properties under the normal condition (20° C., 101.3 kPa).

The metal 202 has positive thermal expansion properties under the normal condition. The metal 202 may be a pure metal or an alloy, and may contain components other than a metal element so as to adjust properties and prevent oxidation. Some Invar alloys have thermal expansion properties very close to zero. However, most of metal materials generally commercially available have positive thermal expansion properties at 20° C.

In order for the solid body 201 to fully exhibit the effect of suppressing the thermal expansion of the anti-thermally-expansive member 2, the coefficient of linear thermal expansion $\alpha$ at 20° C. of the metal 202 is preferably $10 \times 10^{-6}$/K or more and $30 \times 10^{-6}$/K or less.

Examples of the general-purpose metal whose linear expansion coefficient $\alpha$ at 20° C. is in the above-mentioned range include iron ($11.8 \times 10^{-6}$/K), palladium ($11.8 \times 10^{-6}$/K), cobalt ($13.0 \times 10^{-6}$/K), nickel ($13.4 \times 10^{-6}$/K), gold ($14.2 \times 10^{-6}$/K), stainless steel ($14.7 \times 10^{-6}$/K), copper ($16.5 \times 10^{-6}$/K), phosphor bronze ($17.0 \times 10^{-6}$/K), brass ($17.5 \times 10^{-6}$/K) and general copper alloys; silver ($18.9 \times 10^{-6}$/K); and duralumin ($21.6 \times 10^{-6}$/K) and general aluminum alloys; aluminum ($23.1 \times 10^{-6}$/K); and a magnesium alloy ($27.4 \times 10^{-6}$/K). The numerical values in parentheses indicate typical values of coefficients of linear expansion at 20° C. of respective metals, and there is a slight error depending upon the addition of a trance amount of components and the method of measuring a linear expansion coefficient. For example, stainless steel may vary in linear expansion coefficient depending upon its composition ratio. The linear expansion coefficient $\alpha$ at 20° C. of general-purpose stainless steel is in the range of about $10 \times 10^{-6}$/K or more and $30 \times 10^{-6}$/K or less. Regarding the values of coefficients of linear expansion, mainly Chronological Scientific Tables 2007 (Maruzen) was referred to.

When the linear expansion coefficient $\alpha$ at 20° C. of the metal 202 is smaller than $10 \times 10^{-6}$/K, the negative thermal expansion effect of the solid body 201 becomes too large, which may cause a negative volume change in the anti-thermally-expansive member 2.

On the other hand, when the linear expansion coefficient $\alpha$ at 20° C. of the metal 202 is larger than $30 \times 10^{-6}$/K, the positive thermal expansion properties of the anti-thermally-expansive member 2 may not be suppressed.

In order to use the anti-thermally-expansive member of the present invention as a heat sink (radiator plate, radiator case), it is preferred that the thermal conductivity $\kappa$ at 0° C. of the metal having the positive linear expansion coefficient be 100 W/mK or more and 410 W/mK or less. Examples of the general-purpose metal whose linear expansion coefficient $\alpha$ at 0° C. is in the above-mentioned range include cobalt (100 W/mK), zinc (117 W/mK), iridium (147 W/mK), tungsten (177 W/mK), aluminum (236 W/mK), duralumin (134 W/mK) and general aluminum alloys; and gold (319 W/mK), copper (403 W/mK), phosphor bronze (133 W/mK), brass (106 W/mK) and general copper alloys.

When the thermal conductivity $\kappa$ at 0° C. of the metal 202 is smaller than 100 W/mK, there is a possibility that the heat radiation property of the anti-thermally-expansive member 2 as a heat sink may not be sufficient.

On the other hand, the metal 202 having a heat conductivity $\kappa$ at 0° C. of more than 410 W/mK has a particularly large heat radiation property, and hence, the increase in temperature of the anti-thermally-expansive member 2 becomes small. Therefore, even when the solid body 201 is joined to the metal 202, an effect for suppressing thermal expansion is small.

Considering the degree of cancellation of thermal expansion when joined to the solid body 201 and the heat radiation property as a heat sink, it is preferred that the metal 202 contain at least one of aluminum and copper as a component. In addition, aluminum, an aluminum alloy, copper, and a copper alloy are easily available and are also excellent in processability and joining property.

Although interfaces of the solid body 201 and the metal 202 is not shown, the interfaces are joined to each other.

It is preferred that the interfaces of the solid body 201 and the metal 202 are joined to each other with such a strength that thermal stress generated in the solid body 201 and the metal 202 can be propagated. However, a joining method is not limited.

For example, the interfaces of the solid body 201 and the metal 202 may be joined to each other via a solid insert material, a liquid brazing material, or an organic adhesive generally used for joining a metal material to a ceramic material, or may be directly joined to each other using friction welding, metal deposition on a surface by a laser, or using high temperature and high pressure.

Figure 2B:
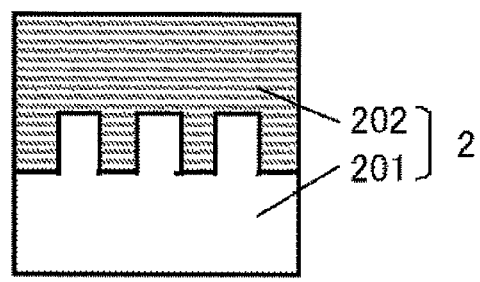

FIG. 2B is a vertical cross-sectional schematic view showing an example of another embodiment of the anti-thermally-expansive member of the present invention. The joining interface between the solid body 201 and the metal 202 may have a complicated shape. The uniformity of the thermal expansion properties in the anti-thermally-expansive member 2 and the joining property of the solid body 201 and the metal 202 may be enhanced by enlarging the surface area of the interface.

Figure 2C:
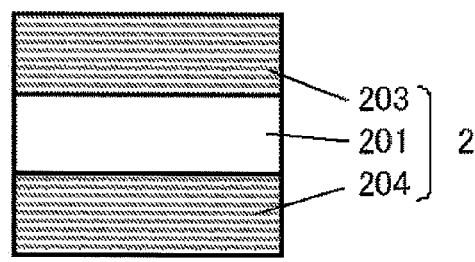

FIG. 2C is a vertical cross-sectional schematic view showing an example of another embodiment of the anti-thermally-expansive member of the present invention. A first metal 203 and a second metal 204 are shown in the figure. The anti-thermally-expansive member 2 of the present invention may have a sandwiched structure in which the solid body 201 is sandwiched between the first metal 203 and the second metal 204. By placing a metal on the surface of the anti-thermally-expansive member 2, the effect of enhancing the heat radiation property of the anti-thermally-expansive member 2 can be expected. The first metal 203 and the second metal 204 may have the same composition or different compositions. For example, when a patterned copper foil is used for the first metal 203 and an aluminum block is used for the second metal 204, a metal base substrate with reduced influence of thermal expansion while keeping the heat radiation property can be produced.

Figure 2D:
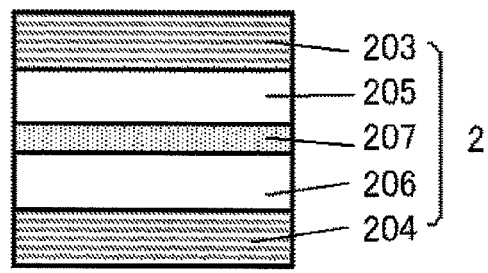

FIG. 2D is a vertical cross-sectional schematic view showing an example of another embodiment of the anti-thermally-expansive member of the present invention. A first solid body 205, a second solid body 206, and an insulator 207 are shown in the figure. The solid body portion (thermal expansion suppressing member of the present invention) of the anti-thermally-expansive member of the present invention becomes a conductor when undergoing phase transition to the second phase (high-temperature phase). Then, if the insulator 207 is added to the construction, the first metal 203 and the second metal 204 can be made electrically independent from each other. A material for the insulator 207 is not limited as long as the material is capable of being joined to the solid body. For example, insulative ceramics, insulative glasses, and insulative organic polymers can be used.

Figure 2E:
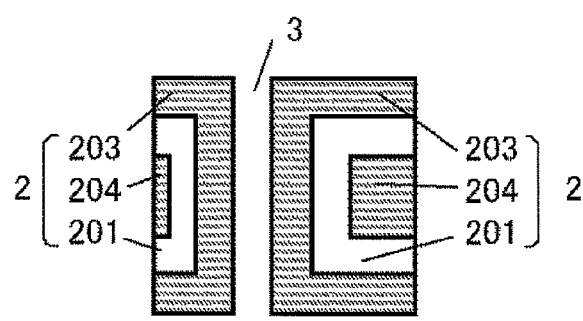

FIG. 2E is a vertical cross-sectional schematic view showing an example of another embodiment of the anti-thermally-expansive member of the present invention. A through-hole 3 passes through the anti-thermally-expansive member 2 from the upper surface to the lower surface. Although the anti-thermally-expansive member 2 is divided into the right and the left in the schematic view for convenience, the anti-thermally-expansive member 2 is actually an integrated member. The first metal 203 is in an electrically equivalent state through the inner wall of the through-hole 3. In the first metal 203, another metal material may be used for the inner wall of the through-hole 3 for convenience of setting. On the other hand, the solid body 201 and the second metal 204 are contained in the first metal 203. For example, when a patterned copper foil is used for the first metal 203 and an aluminum block is used for the second metal 204, an aluminum core substrate with reduced influence of thermal expansion while keeping the heat radiation property can be produced.

Figure 2F:
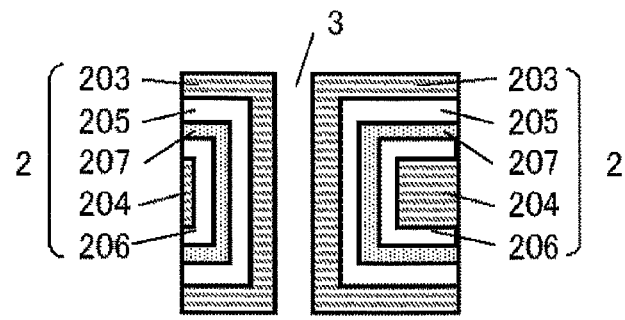

FIG. 2F is a vertical cross-sectional schematic view showing an example of another embodiment of the anti-thermally-expansive member of the present invention. The first metal 203 and the second metal 204 can be made electrically independent from each other by adding the insulator 207 to the construction.

Figure 2G:
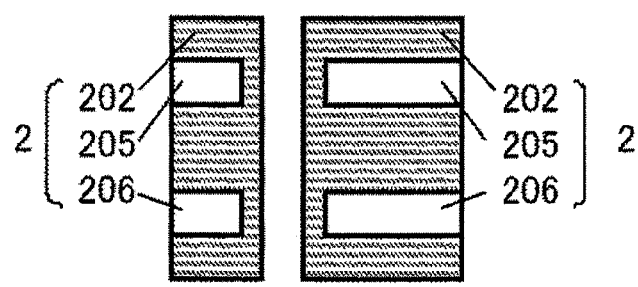

FIG. 2G is a vertical cross-sectional schematic view showing an example of another embodiment of the anti-thermally-expansive member of the present invention. For example, when the surface layer portion of the metal 202 is formed of a patterned copper foil and the core portion is formed of a copper plate, a copper core substrate with reduced influence of thermal expansion while keeping the heat radiation property can be produced.

Figure 2H:
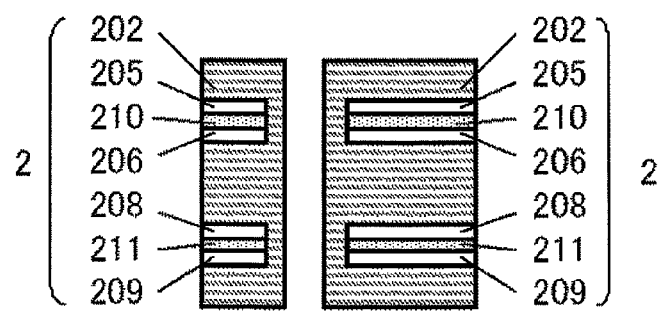

FIG. 2H is a vertical cross-sectional schematic view showing an example of another embodiment of the anti-thermally-expansive member of the present invention. A third solid body 208, a fourth solid body 209, a first insulator 210, and a second insulator 211 are shown in the figure.

The anti-thermally-expansive member of the present invention can be used not only for the heat radiation printed board as described above, but also for devices and products used under temperature-changing environments, such as a heat radiation substrate used in an LED element or the like, a structural material for a precision actuator, a base for an organic photosensitive body, an optical spacer member, an electrode, and a spring.

EXAMPLES

Hereinafter, the present invention is described more specifically by way of examples. However, the present invention is not limited to the following examples.

Example 1

Bismuth oxide ($Bi_2O_3$), lanthanum oxide ($La_2O_3$), and metal nickel (Ni) were dissolved in a molar ratio of 98/2/100 in minimum nitric acid and stirred thoroughly. A solid body obtained by evaporating and drying the solution thus obtained was calcinated in an electric furnace under an air atmosphere at 750° C. for 12 hours to obtain oxide powder. The oxide powder with 20% by weight of potassium perchlorate ($KClO_4$) mixed therewith was sealed in a capsule made of gold. The capsule was compressed to 6 GPa with a cubic anvil-type high-pressure generator. The capsule under compression was heated at 1,000° C. and kept at this temperature for 30 minutes. After that, the capsule was quenched followed by removal of the pressure, and a sample was taken out. The sample thus taken out was crushed and washed with water to remove a potassium chloride (KCl) component. The remaining crushed sample was dried to obtain the powdery thermal expansion suppressing member of the present invention.

According to X-ray diffraction measurement, the powdery thermal expansion suppressing member had a triclinic perovskite structure at room temperature (20° C.) and underwent phase transition to an orthorhombic perovskite structure at around 180° C. In addition, the atomic ratio of bismuth, lanthanum, and nickel was found to be substantially the same as a charged ratio according to the X-ray fluorescence analysis. Therefore, it was found that the composition formula of the thermal expansion suppressing member of the present invention was able to be represented by $Bi_{0.98}La_{0.02}NiO_3$.

Next, for the purpose of forming a solid body from the powdery thermal expansion suppressing member, the powdery thermal expansion suppressing member was sealed in a capsule made of gold. The capsule was compressed to 6 GPa and heated at 800° C. for 30 minutes. The capsule was quenched followed by removal of the pressure, and a sample was taken out. The sample thus taken out was a pellet-shaped solid body. The surface of the pellet was polished to obtain a disk-shaped thermal expansion suppressing member of the present invention with a diameter of 2.5 mm and a thickness of 0.5 mm. A strain gauge (produced by Kyowa Electronic Instruments Co., Ltd.) was attached to the disk-shaped thermal expansion suppressing member, using an adhesive (PC-6, produced by Kyowa Electronic Instruments Co., Ltd.), and a linear expansion coefficient was measured from the strain at temperatures from 0° C. to 130° C.

Consequently, the member exhibited a linear reduction in volume with respect to the increase in temperature in the entire temperature region, and the value of the typical linear expansion coefficient $\alpha$ determined by the tangent at 20° C. was $-21 \times 10^{-6}$/K.

Examples 2 to 46

Bismuth oxide ($Bi_2O_3$), metal nickel (Ni), and an oxide of metal M ($M_2O_3$) were dissolved in minimum nitric acid so as to obtain the same molar ratio as that of the intended composition shown in Table 1, followed by the same procedure in Example 1, and thus, a powdery and disk-shaped thermal expansion suppressing member of the present invention was obtained.

According to X-ray diffraction measurement of the powdery sample, it was confirmed that the thermal expansion suppressing members of Examples 2 to 46 had the same crystal structure as that of Example 1. Further, any of the samples of Examples 2 to 46 exhibited phase transition behavior to an orthorhombic system, but the transition temperatures were different from each other. The transition temperature tended to shift to lower temperatures as the substitution amount of the metal M increased, and the shift width tended to increase as the ion radius of the metal M was larger.

The value of the linear expansion coefficient $\alpha$ in the range of 0° C. to 100° C. calculated by subjecting the results of the X-ray diffraction measurement of the thermal expansion suppressing member of Example 2 to the Rietveld refinement was $-137 \times 10^{-6}$/K. The linear expansion coefficient was a theoretical value peculiar to the material for which the influence of voids (pores) and microstructural defects possibly contained in the thermal expansion suppressing member of the present invention is removed.

It was confirmed by X-ray fluorescence analysis that the thermal expansion suppressing members of Examples 2 to 46 had the intended compositions shown in Table 1.

Next, the linear expansion coefficient of a disk-shaped sample was measured in the same way as in Example 1. As a result, all the samples exhibited linear and negative thermal expansion properties in the entire region from 0° C. to 130° C. As the trivalent ion radius of the metal M was smaller, the magnitude of strain at temperature increase tended to be matched with that at temperature decrease.

The typical coefficients of linear expansion α at 20° C. of the thermal expansion suppressing members of Examples 2 to 46 were $-19 \times 10^{-6}$/K to $-28 \times 10^{-6}$/K. The specific value of the linear expansion coefficient α at 20° C. of each sample is as shown in Table 1.

Comparative Example 1

Metal oxide powder and a metal oxide disk for comparison were synthesized in the same way as in Example 1, except that the substitution of La with respect to Bi sites was not conducted.

According to X-ray diffraction measurement, the metal oxide had a triclinic perovskite crystal at room temperature (20° C.), and underwent phase transition to an orthorhombic perovskite structure at around 230° C. The oxide was thermally decomposed at the same time as the phase transition, and hence, the oxide did not return to the triclinic perovskite structure at temperature decrease.

Next, the linear expansion coefficient of the disk-shaped sample was measured in the same way as in Example 1, and as a result, the disk-shaped sample exhibited positive thermal expansion properties in the region of 0° C. to 30° C. In the region of 30° C. or higher, negative thermal expansion properties were observed partially, but the properties were not reversible in repeated measurements. The typical linear expansion coefficient α at 20° C. was $+3 \times 10^{-6}$/K.

Comparative Example 2

Metal oxide powder and a metal oxide disk for comparison were synthesized in the same way as in Example 1, except for setting the substitution ratio of La with respect to the Bi sites to be 20%.

According to X-ray diffraction measurement, the metal oxide was an orthorhombic or rhombohedral perovskite crystal at room temperature (20° C.) However, the phenomenon of crystal phase transition was not confirmed by temperature scanning up to 300° C.

Next, the linear expansion coefficient of a disk-shaped sample was measured in the same way as in Example 1, and as a result, the disk-shaped sample exhibited positive thermal expansion properties in the entire region of 0° C. to 130° C. The typical linear expansion coefficient α at 20° C. was $+2 \times 10^{-6}$/K.

TABLE 1

| | M | x | α(×10⁻⁶/K) |
|---|---|---|---|
| Example 1 | La | 0.02 | −21 |
| Example 2 | La | 0.05 | −23 |
| Example 3 | La | 0.10 | −24 |
| Example 4 | La | 0.15 | −24 |
| Example 5 | Pr | 0.02 | −22 |
| Example 6 | Pr | 0.05 | −24 |
| Example 7 | Pr | 0.15 | −24 |
| Example 8 | Nd | 0.02 | −22 |
| Example 9 | Nd | 0.05 | −25 |
| Example 10 | Nd | 0.15 | −25 |
| Example 11 | Sm | 0.02 | −22 |
| Example 12 | Sm | 0.05 | −25 |
| Example 13 | Sm | 0.15 | −25 |
| Example 14 | Eu | 0.02 | −24 |
| Example 15 | Eu | 0.05 | −26 |
| Example 16 | Eu | 0.15 | −26 |
| Example 17 | Gd | 0.02 | −24 |
| Example 18 | Gd | 0.05 | −26 |
| Example 19 | Gd | 0.15 | −26 |
| Example 20 | Tb | 0.02 | −24 |
| Example 21 | Tb | 0.05 | −26 |
| Example 22 | Tb | 0.15 | −27 |
| Example 23 | Dy | 0.02 | −24 |
| Example 24 | Dy | 0.05 | −27 |
| Example 25 | Dy | 0.15 | −27 |
| Example 26 | Ho | 0.02 | −25 |
| Example 27 | Ho | 0.05 | −26 |
| Example 28 | Ho | 0.15 | −27 |
| Example 29 | Er | 0.02 | −26 |
| Example 30 | Er | 0.05 | −27 |
| Example 31 | Er | 0.15 | −28 |
| Example 32 | Tm | 0.02 | −24 |
| Example 33 | Tm | 0.05 | −26 |
| Example 34 | Tm | 0.15 | −28 |
| Example 35 | Yb | 0.02 | −24 |
| Example 36 | Yb | 0.05 | −25 |
| Example 37 | Yb | 0.15 | −27 |
| Example 38 | Lu | 0.02 | −25 |
| Example 39 | Lu | 0.05 | −27 |
| Example 40 | Lu | 0.15 | −27 |
| Example 41 | Y | 0.02 | −19 |
| Example 42 | Y | 0.05 | −22 |
| Example 43 | Y | 0.15 | −23 |
| Example 44 | In | 0.02 | −19 |
| Example 45 | In | 0.05 | −21 |
| Example 46 | In | 0.15 | −22 |
| Comparative Example 1 | None | 0.00 | +3 |
| Comparative Example 2 | La | 0.20 | +2 |

Example 47

A thermal expansion suppressing member of the present invention was produced in the same way as in Example 2, except for controlling sintering so that the moisture amount in the sintering process became small. If a capsule for synthesis under a high pressure contains water, a hydrothermal reaction is liable to occur in the sintering process, and thus, crystal grains tend to become large.

Bismuth oxide ($Bi_2O_3$), lanthanum oxide ($La_2O_3$), and metal nickel (Ni) were dissolved in a molar ratio of 95/5/100 in minimum nitric acid and stirred thoroughly. A solid body obtained by evaporating and drying the solution thus obtained was calcinated in an electric furnace under an air atmosphere at 750° C. for 12 hours to obtain oxide powder. The oxide powder with 20% by weight of potassium perchlorate ($KClO_4$) previously dried at 150° C. mixed therewith was sealed in a capsule made of gold. The capsule was compressed to 6 GPa with a cubic anvil-type high-pressure generator. The capsule under compression was heated at 1,000° C. and kept at this temperature for 30 minutes. After that, the capsule was quenched followed by removal of the pressure, and a sample was taken out. The sample thus taken out was crushed and washed with water to remove a potassium chloride (KCl) component. The remaining crushed sample was dried by heating at 150° C. to obtain a powdery thermal expansion suppressing member of the present invention. A disk-shaped thermal expansion suppressing member of the present invention was also obtained in the same way as in Example 1.

It was confirmed by X-ray diffraction measurement of the powdery sample that the thermal expansion suppressing member of Example 47 had the same crystal structure as those of Examples 1 to 46. The value of the linear expansion coefficient α in a range of 0° C. to 100° C. calculated by subjecting the results of the X-ray diffraction measurement to the Rietveld refinement was $-137 \times 10^{-6}$/K in the same way as in Example 2.

The atomic ratio of bismuth, lanthanum, and nickel was found to be substantially the same as the charged ratio according to the X-ray fluorescence analysis. Therefore, it was found that the composition formula of the thermal expansion suppressing member of the present invention was able to be represented by $Bi_{0.95}La_{0.06}NiO_3$.

Next, the linear expansion coefficient of the disk-shaped sample was measured in the same way as in Example 1. As a result, the disk-shaped sample exhibited linear and negative thermal expansion properties in the entire region of 0° C. to 130° C., and the linear expansion coefficient α at 20° C. was $-82 \times 10^{-6}$/K. This linear expansion coefficient was larger than $-23 \times 10^{-6}$/k of Example 2, and it is understood that the linear expansion coefficient can be controlled by production conditions even with the same composition.

Example 48

A disk-shaped aluminum plate was attached to a thermal expansion suppressing member in the same shape with a diameter of 2.5 mm and a thickness of 0.5 mm produced in Example 2 to obtain an anti-thermally-expansive member of the present invention. For attachment, a heat-curable epoxy-based adhesive was used.

A strain gauge was attached to both surfaces of the anti-thermally-expansive member, and the linear expansion coefficient was measured from strains at 20° C. to 100° C. As a result, almost no volume change was found in the entire region, and the typical linear expansion coefficient, as determined by the tangent at 20° C., was within $\pm 0.5 \times 10^{-6}$/K. Considering the measurement precision of strain, it can be said that this anti-thermally-expansive member has almost zero thermal expansion. The reason for this is considered as follows: the linear expansion coefficient ($23 \times 10^{-6}$/K at 20° C.) of aluminum and the linear expansion coefficient ($-23 \times 10^{-6}$/K at 20° C.) of the thermal expansion suppressing member of Example 2 cancelled each other.

Example 49

The anti-thermally-expansive member of the present invention was produced, using a copper plate instead of the aluminum plate used in Example 48. The thermal expansion at 20° C. to 100° C. was able to be reduced to almost zero by adjusting the volume ratio between the metal portion and the ceramics portion.

In addition, even in the anti-thermally-expansive members obtained by joining the thermal expansion suppressing members of Example 1 and Examples 3 to 47 to various metal members such as an aluminum plate and a copper plate, the effect of reducing the degree of volume change by external heat was obtained.

According to the present invention, the thermal expansion suppressing member having negative thermal expansion properties can be provided. Further, according to the present invention, the metal-based anti-thermally-expansive member having extremely small thermal expansion can be provided by joining the thermal expansion suppression member of the present invention to a metal.

The metal-based anti-thermally-expansive member of the present invention can be used in devices and products used under temperature-changing environments, such as a heat radiation printed board, a heat radiation substrate used in an LED element or the like, a structural material for a precision actuator, a base for an organic photosensitive body, an optical spacer member, an electrode, and a spring.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2010-180885, filed Aug. 12, 2010, and No. 2011-097851, filed Apr. 26, 2011, which are hereby incorporated by reference herein in their entirety.

What is claimed is:

1. A member, comprising:
   a metal having a positive linear expansion coefficient at 20° C.; and
   a solid body including at least an oxide represented by general formula (1):

$$(Bi_{1-x}M_x)NiO_3 \qquad (1),$$

where M represents at least one metal selected from the group consisting of La, Pr, Nd, Sm, Eu, Gd, Tb, Dy, Ho, Er, Tm, Yb, Lu, Y, and In; and x represents a numerical value of $0.02 \leq x \leq 0.15$,
   wherein the metal having a positive linear expansion coefficient at 20° C. and the solid body are joined to each other, and
   wherein a linear expansion coefficient at 20° C. of the member is less than that of the metal.

2. A member according to claim 1, wherein a linear expansion coefficient α at 20° C. of the metal having a positive linear expansion coefficient is $10 \times 10^{-6}$/K or more and $30 \times 10^{-6}$/K or less.

3. A member according to claim 1, wherein a thermal conductivity κ at 0° C. of the metal having a positive linear expansion coefficient is 100 W/mK or more and 410 W/mK or less.

4. A member according to claim 3, wherein the metal having a positive linear expansion coefficient comprises at least one of aluminum and copper as a component.

* * * * *